(12) United States Patent
Cheng et al.

(10) Patent No.: US 7,675,401 B2
(45) Date of Patent: Mar. 9, 2010

(54) ELECTRONIC CIRCUIT BOARD

(75) Inventors: Ka Wai Eric Cheng, Hong Kong (CN); Chak Yin Tang, Hong Kong (CN)

(73) Assignee: The Hong Kong Polytechnic University, Kowloon (HK)

( * ) Notice: Subject to any disclaimer, the term of this patent is extended or adjusted under 35 U.S.C. 154(b) by 1057 days.

(21) Appl. No.: 11/148,444

(22) Filed: Jun. 9, 2005

(65) Prior Publication Data

US 2005/0263321 A1    Dec. 1, 2005

Related U.S. Application Data

(63) Continuation-in-part of application No. 10/265,200, filed on Oct. 7, 2002, now abandoned.

(51) Int. Cl.
*H01C 1/012* (2006.01)
(52) U.S. Cl. .................. 338/309; 338/223; 338/226
(58) Field of Classification Search .............. 338/309, 338/307, 308, 223, 224, 226
See application file for complete search history.

(56) References Cited

U.S. PATENT DOCUMENTS

| | | | |
|---|---|---|---|
| 4,643,499 A | | 2/1987 | Mitchell |
| 4,711,814 A | * | 12/1987 | Teichmann ............... 428/403 |
| 5,140,706 A | | 8/1992 | Maeda et al. |
| 5,180,513 A | | 1/1993 | Durand |
| 5,353,001 A | | 10/1994 | Meinel et al. |
| 5,648,320 A | | 7/1997 | Jacobs |
| 5,785,913 A | | 7/1998 | Clark, Jr. et al. |
| 5,793,096 A | | 8/1998 | Yu et al. |
| 5,898,991 A | | 5/1999 | Fogel et al. |
| 5,973,929 A | | 10/1999 | Arakawa et al. |
| 6,252,487 B1 | | 6/2001 | Wolf et al. |
| 6,287,931 B1 | | 9/2001 | Chen |
| 6,317,948 B1 | | 11/2001 | Kola et al. |
| 6,483,719 B1 | | 11/2002 | Bachman |
| 2002/0182374 A1 | | 12/2002 | Tung |
| 2003/0121602 A1 | | 7/2003 | Hsich et al. |

FOREIGN PATENT DOCUMENTS

JP    4-151889    5/1992

OTHER PUBLICATIONS

NB8910187, IBM TDB abstract and Fig. only (Oct. 1989).
Fairchild et al., "Reliability of Flexible Thin-Film Embedded Resistors and Electrical Characterization of Thin-Film Embedded Capacitors and Inductors", (1997) p. 730-738, Electronic components and Technology Conference.
Lenihan et al., "Embedded Thin Film resistors, Capacitors and Inductors in Flexible Polyimide Films", (1996) p. 119-124, Electronic Components and Technology Conference.
Yin et al., "Experimental Characterization And Modeling of On-Chip Capacitors and Resistors on GaAs Substrates", vol. 149, No. 1 (Feb. 2002) p. 50-52, IEE Proc-Microw. Antennas Propag.

* cited by examiner

*Primary Examiner*—Kyung Lee
(74) *Attorney, Agent, or Firm*—Leydig, Voit & Mayer, Ltd.

(57) ABSTRACT

A circuit board, for an electronic circuit having a passive circuit component, has a component region, a non-component region, and circuit wiring conductors on its surface. The component region includes a polymer composition comprising a mixture of polymer resin and filler material that, in combination with the circuit wiring conductors, forms the passive circuit component.

17 Claims, 3 Drawing Sheets

ELECTRONIC CIRCUIT BOARD

This disclosure is a continuation-in-part of U.S. patent application Ser. No. 10/265,200 filed Oct. 7, 2002.

BACKGROUND TO THE INVENTION

1. Field of the Invention

The present invention relates to electronic circuit boards and to methods of making electronic circuit boards.

2. Background Information

Existing Printed Circuit Boards (PCBs) comprise a sheet of non-conductive material, typically fiberglass reinforced polymer, laminated with a conductive layer of copper. The copper can be laminated on both the top and bottom surfaces of the polymer sheet. Portions of the copper are removed by printing and etching to leave conductive copper tracks on the surfaces of the polymer sheet. Holes are drilled through the copper tracks and underlying polymer sheet to allow connection of electronic components on the top layer and/or bottom layer on the PCB. The components are therefore connected and exposed externally on the PCB.

In modern electronic circuits a great deal of the circuitry is comprised of Integrated Circuits (ICs) soldered to the PCB. This allows for a large number of active components to be mass produced into small packages that occupy little space of the PCB surface. However, a number of passive components such as inductors and capacitors cannot be manufactured in an IC package and so discrete components must be mounted separately on the PCB.

Discrete circuit components occupy greater space on the PCB and the external wiring conductors needed to connect them cause electromagnetic interference. The use of discrete circuit components also increases circuit layout complexity and thus assembly and manufacturing costs.

SUMMARY OF THE INVENTION

It is an object of the present invention to provide an electronic circuit board, and a method of making said electronic circuit board, which ameliorates the above problems, or which at least provides the public with a useful alternative.

According to a first aspect of the invention there is provided a circuit board for an electronic circuit having a passive circuit component, the circuit board comprising a polymer substrate having a component region and a non component region and circuit wiring conductors on its surface, wherein the component region is formed from a polymer composition comprising a mixture of polymer resin and filler material that in combination with the circuit wiring conductors form the passive circuit component.

Preferably, the filler material is a bulk solid.

Preferably, the filler material comprises a bulk solid having particles with an average diameter in a range of 1 to 18 microns.

Preferably, the circuit board further includes holes in the substrate adjacent the component region and wherein the wiring conductors comprise a coil passing through the holes and about the component region.

Preferably, the circuit wiring conductors are laminated on opposite sides of the substrate proximate the component region.

Preferably, the component region has an annular shape and the wiring conductors are radial to the component region.

Preferably, the filler material is a bulk solid comprising one of cobalt, nickel, polyester, polypropylene, graphite or silver particles.

According to a second aspect of the invention there is provided a method of making a circuit board comprising a polymer substrate having a component region and a non component region and circuit wiring conductors on its surface, wherein the component region is formed from a polymer composition comprising a mixture of polymer resin and filler material that in combination with the circuit wiring conductors form the passive circuit component, the method comprising:

making the component region in a required shape,
  arranging the component region in a mold,
  applying polymer to the mold to form a board incorporating the component region, and
  providing circuit wiring conductors on the board that in combination with the component region form the passive circuit component.

Preferably, the method further includes grinding surfaces of the board to expose a surface of the component region prior to providing the circuit wiring conductors on the board.

Preferably, providing circuit wiring conductors on the board includes applying a film of copper to one or both sides of the board, and etching portions of the copper film to reveal conductive tracks on said sides of the board.

Further aspects of the invention will become apparent from the following description, which is given by way of example only.

BRIEF DESCRIPTION OF THE DRAWINGS

Embodiments of the invention will now be described with reference to the accompanying drawings in which.

DETAILED DESCRIPTION OF THE INVENTION

Figure 1:
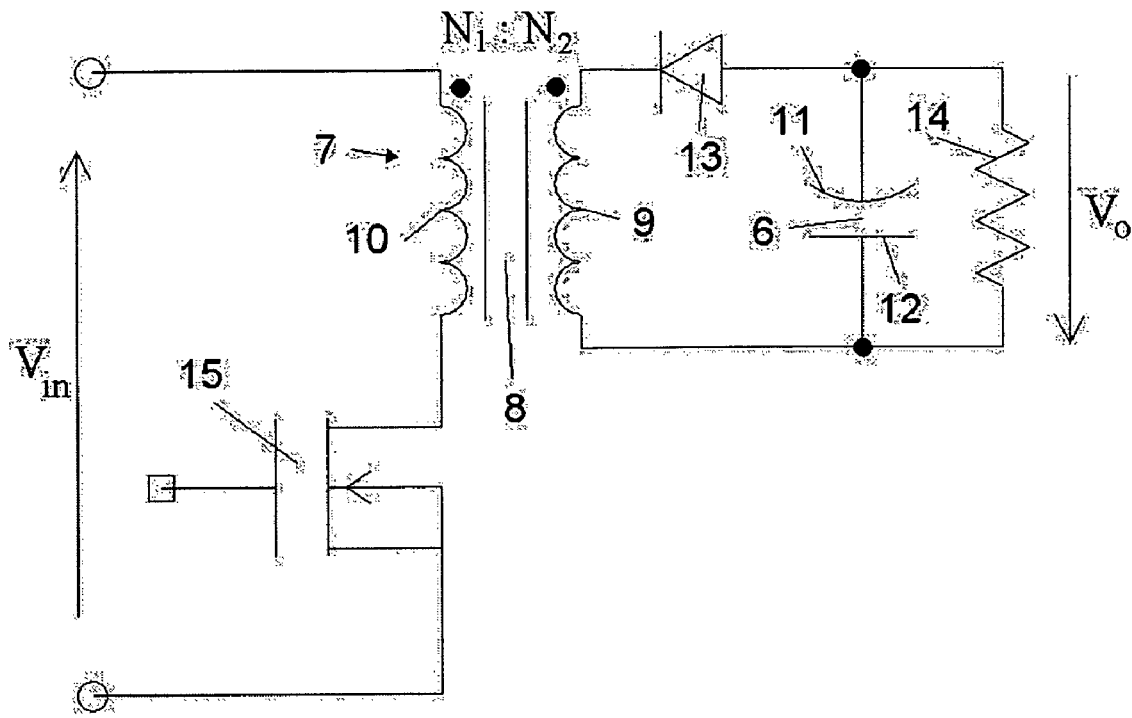
FIG. 1 is a view of typical electronic circuit that is mounted on a PCB.

The invention will be described with reference to a flyback converter circuit as shown in FIG. 1. Operation of this simple circuit will be apparent to the skilled addressee, as will the fact that device 7 acts as both a transformer and inductor in the circuit. The magnetic core of the transformer/inductor 7 and dielectric of capacitor 6 are integrated into the circuit board to eliminate the need for these two discrete circuit components. Use of this circuit to illustrate the invention is not intended to be limiting on use of the invention. A circuit board according to the invention can be applied to any electronic circuit that requires discrete passive components such as transformers, inductors, capacitors and/or resistors mounted on a circuit board.

Figure 2:
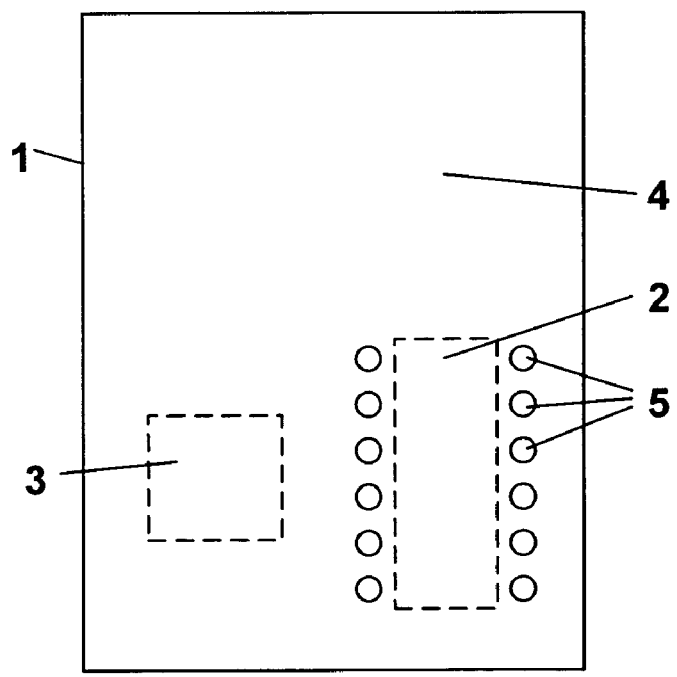
FIG. 2 illustrates a circuit board according to the invention having integrated component and non component regions.
Figure 3:
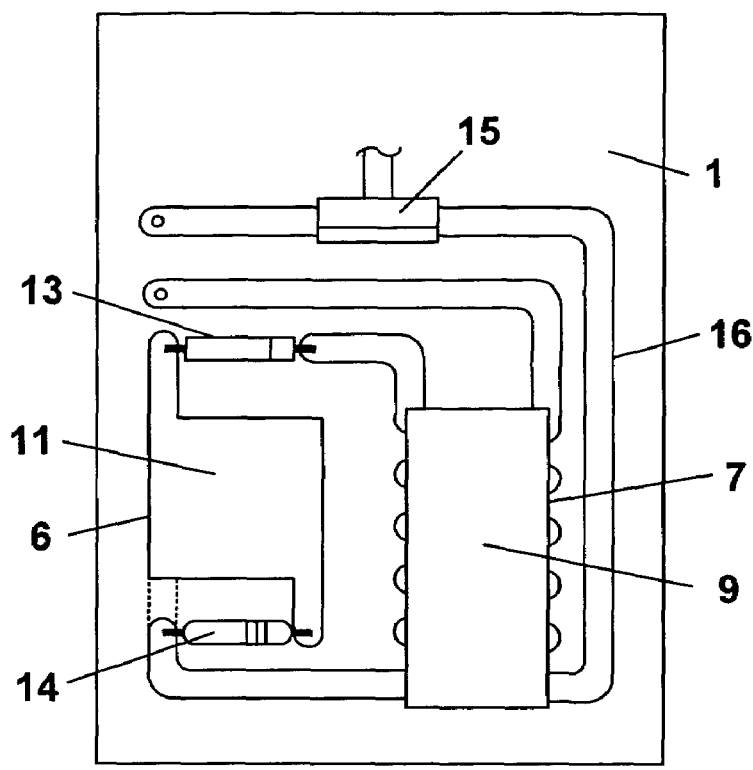
FIG. 3 illustrates the circuit board of FIG. 2 populated with the circuit wiring and components of FIG. 1.

Referring to FIG. 2, the circuit board 1 for the flyback converter circuit of FIG. 1 is made of a polymer resin substrate with two distinct component regions 2, 3 integrally formed with a non component region 4. The first component region 2 provides a magnetic core for the transformer/inductor 7, and the second component region 3 provides the dielectric of capacitor 6. The two component regions 2, 3 are formed from a polymer composition comprising a mixture of polymer resin embedded filler materials that in combination with circuit wiring conductors on the board surface form the transformer/inductor 7 and capacitor 6. The embedded filler material is in the form of a bulk solid such as a powder or granulated material.

The circuit wiring conductors are provided on the board surface by etching a laminated copper layer, in known manner, and/or by way of wire conductors wound on or soldered to the board.

The embedded filler of component region 2 is a magnetic material that gives the region the magnetic properties required to form the core 8 of transformer/inductor 7. A plurality of holes 5 are drilled either side of component region 2 to allow copper wire to be wound in loops though the circuit board 1 forming first and second windings 9, 10 about component region 2.

The embedded filler of second component region 3 is a dielectric material that gives the region the dielectric properties required to form the dielectric of capacitor 6. During etching of circuit wiring conductors 16 on the board 1 surface copper pads are formed on either side of the circuit board 1 over the second component region 3 to form the plates 11 and 12 of the capacitor 6.

Circuit wiring conductors 16 are provided on non component region 4 and the board 1 drilled for the diode 13, resistor 14, semiconductor switch 15 and a switching IC (not shown) in the same manner as known PCBs. Unlike known PCBs the transformer/inductor 7 and capacitor 6 are integrated into the board 1.

The polymer circuit board 1 is made by first forming the two composite component regions 2, 3 in the required shape. The shape is designed according to the packaging and the component parameters, in this case inductance and capacitance. The only restrictive condition on the shape is that the preformed component portions 2, 3 must be no thicker that the proposed thickness of the finished board 1. In the preferred embodiment this is 2 mm. The component portions 2, 3 are made slightly thicker initially as the circuit board 1 is ground or milled to the finished thickness after it is formed and before the copper layer is laminated to it.

A composite magnetic material for the first component region 2 is produced by mixing metal powder filler with epoxy resin and two additives. The epoxy resin is 4,4-isopropylidenediphend epichlorohydrin resin and the two additives are alkyl glycidyl ether and poly-acrylate ether. The cross-linking agent (hardener) for the epoxy resin contains diethylenetriamine and 2-hydroxyethydiethylenetriamine. One part of the hardener is mixed with five parts of epoxy resin.

The metal powder filler comprises spherical cobalt and nickel particles. The particles are in the range of 1-18 micrometers in diameter. The surface of the particles is treated with a titanic coupling agent to enhance disbursement through the epoxy resin and increase the bond strength between the particles and resin.

The ratios of cobalt to nickel particles in the filler and of filler to resin are given in the following table:

| cobalt Particles (weight, g) | nickel Particles (weight, g) | Filler weight-to-weight (%) | Epoxy resin weight-to-weight (%) |
|---|---|---|---|
| 10 | 10 | 45.0 | 55.0 |

The ratio of cobalt to nickel particles and of filler to resin can be varied to alter the magnetic properties of the first component portion 2. Further details of the composite magnetic material can be found in applicant's earlier U.S. patent application Ser. No. 10/177,751 filed on 24 Jun. 2002, and Ser. No. 10/974,021 filed on 27 Oct. 2004.

The second component portion 3 is made by mixing polymer resin with an appropriate dielectric filler material that gives the desired value of capacitance. In the preferred embodiment the dielectric filler material is Polyester. In alternative embodiments it may be Polypropylene or similar materials. The dielectric area, in this example, is preferably pre-molded to the required shape.

The present example does not integrate the resistor into the board 1. To do this a third component region can be provided comprising a polymer composition comprising conductive fillers, such as graphite powder, with a thermoplastic, such as polypropylene. The shape of the resistive area and the filled volume of the conductive filler determine the resistance of the resistive region. Silver also makes an effective resistive filler. The resistive region is also pre-molded to the required shape.

A flat mold is used for producing the finished board 1. The preformed component portions 2, 3 are located in their predetermined positions within the mold and kept in place by a suitable holding means. Epoxy resin is then applied to the mold and allowed to set.

After being formed the set board 1 is ground to the desired thickness of 2 mm. The grinding exposes surfaces of the component portions 2, 3 on the upper and lower sides of the board 1. These upper and lower surfaces of the component portions 2, 3 are not, therefore, covered by epoxy resin.

Thin copper sheets are laminated on to the upper and lower sides of the board 1 in known manner. The copper surfaces are printed, etched and the board drilled in the same manner as known PCBs.

In the above described example the winding conductors of the transformer/inductor 7 are wires wound on after production of the circuit board. In alternative examples the winding conductors of inductors and the like are copper tracks on the magnetic region of the board. These tracks are formed during the printing and etching of the laminated copper layer. Linking of tracks on upper and lower sides of the magnetic region is achieved by copper plating the inside of through-holes in known manner.

In the described example epoxy resin is used to bond the composite component regions 2, 3 and form the non component region 4 of the circuit board. However, any suitable polymer bonder may be used. The polymer bonder must be chosen to be chemically compatible to the composite functional (magnetic, dielectric or resistive) materials. In addition, the bond strength must meet mechanical strength requirement. To achieve this, inert filler material can be blended with the polymer bonder before molding for improving dimensional stability of the board. Details of the type and quantity of fillers can be obtained from the polymer manufacturer or data sheet.

Figure 4:
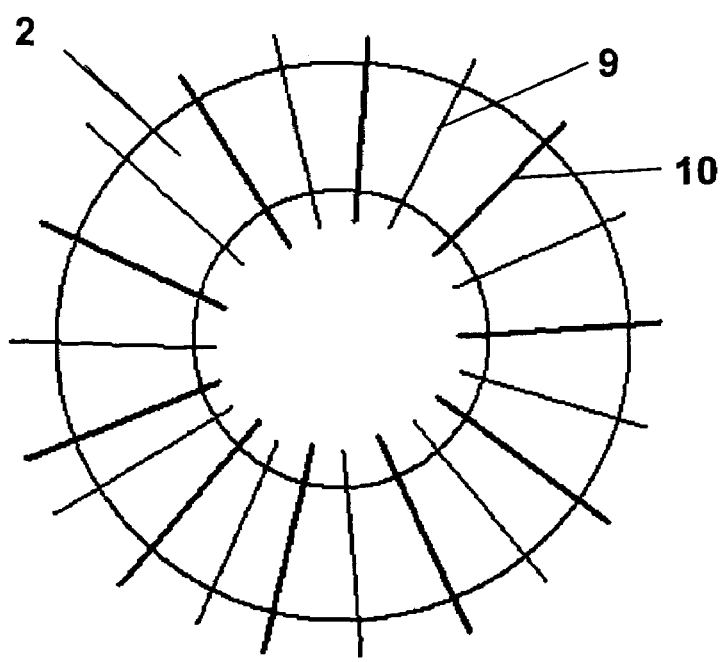
FIG. 4 illustrates an alternative arrangement for a circuit board integrate transformer, and FIG. 5 are signal waveforms from the circuit of FIG. 1 assembled on to a circuit board circuit board according to the invention.

FIG. 4 shows an alternative shape for the magnetic component region 2. The magnetic region 2 is preformed in an annular ring shape and set into the board as described above. The windings 9, 10 of the transformer 7 are wound radially about the annular magnetic ring.

The invention can also find application in surface mount and multi-layer circuit board applications. The principle involved is the same as described here and such application is within the ability of the skilled addressee.

A circuit board according to the invention was tested using the circuit of FIG. 1. The designed circuit parameters for the test were L=7.5μH, C=2 μF, R=185 Ω. The test parameters represent a high frequency power application, because this is more problematic than low frequency applications due to the effect of coupling and electromagnetic interference.

Figure 5:
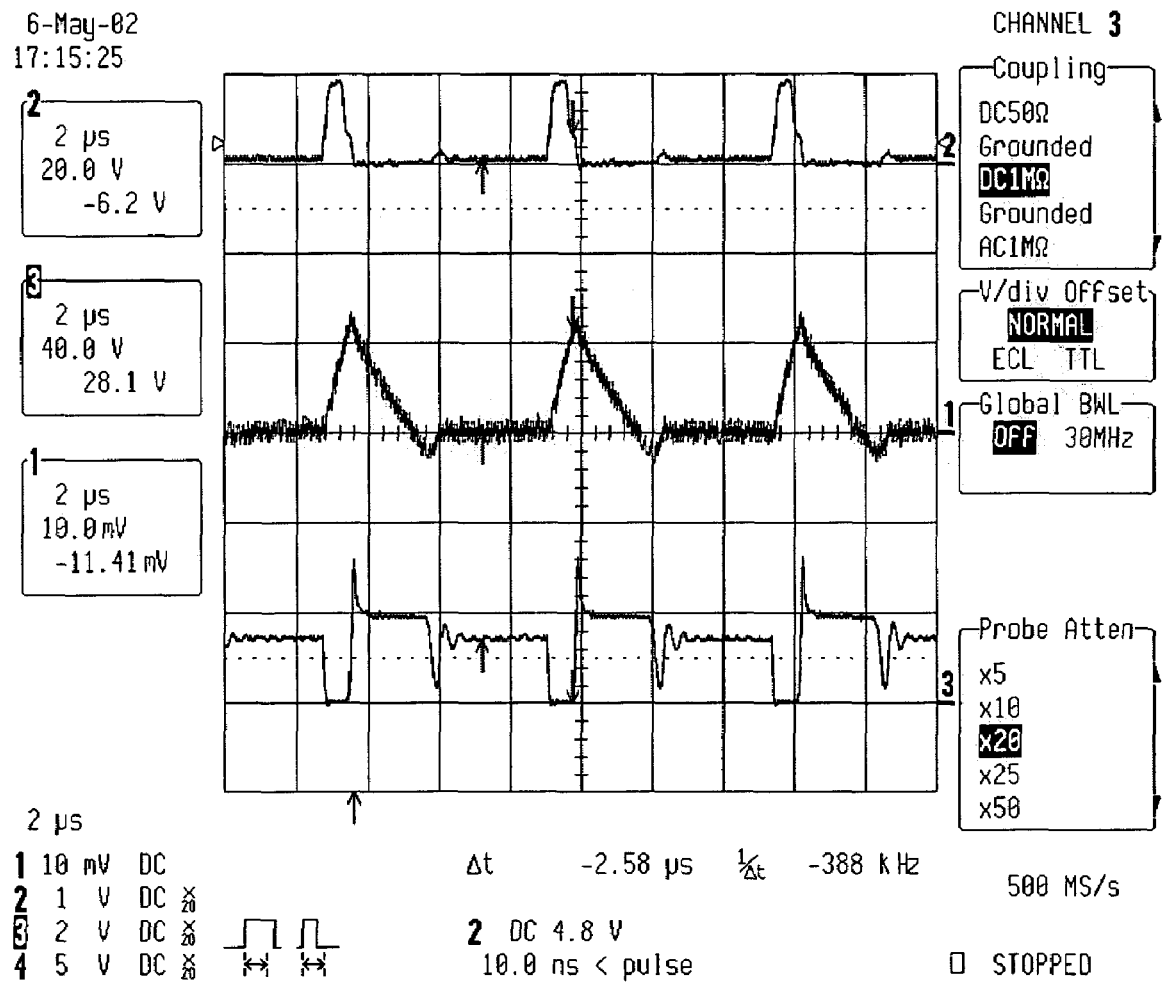

FIG. 5 shows the waveforms from the test circuit under steady-state operation. The input voltage is 29V and 0.38 A. The switching frequency is 165 kHz. The measured efficiency is 70%. The measured waveforms are very clear and very little noise is present. No adverse effect is observed. The performance is the same as for a conventional PCB mounted circuit.

The advantages of the composite circuit board are these. The circuit manufacturing process is simpler because the passive components are embedded in the circuit board so the circuit can be assembled in fewer steps. Polymer bonded magnetic materials enable high permeability to be obtained. Higher relative inductances can be achieved, and inductor size can therefore be reduced. Electrical connections can be established by copper tracks that can be programmed into printing and etching equipment. Some connections can be made by wirebonding, which can also be programmed. The whole process results in reduced cost, manufacturing time and product size. Electromagnetic interference and coupling are reduced.

Where in the foregoing description reference has been made to integers or elements having known equivalents then such are included as if individually set forth herein.

Embodiments of the invention have been described, however it is understood that variations, improvements or modifications can take place without departure from the scope of the appended claims.

What is claimed is:

1. A circuit board for an electronic circuit having a passive circuit component, the circuit board comprising:
   a polymer substrate having
      a non-component region of a substantially uniform composition of a polymer resin,
      a component region of a substantially uniform composition of a mixture of a polymer resin and a particulate filler material, and
      circuit wiring conductors on a surface of the substrate, wherein the filler material, in combination with the circuit wiring conductors, forms the passive circuit component.

2. The circuit board of claim 1 wherein the particulate filler material comprises solid particles with an average diameter in a range of 1 to 18 microns.

3. The circuit board of claim 1 further including holes in the substrate adjacent the component region and wherein the wiring conductors pass through the holes and comprise a coil, with the component region inside the coil.

4. The circuit board of claim 1 wherein the circuit wiring conductors are laminated on opposite sides of the substrate proximate the component region.

5. The circuit board of claim 1 wherein the component region of the substrate has an annular shape on the substrate and the circuit wiring conductors are radially disposed across the annular component region.

6. The circuit board of claim 1 wherein the particulate filler material is selected from the group consisting of particles of cobalt, nickel, polyester, polypropylene, graphite, and silver.

7. A circuit board for an electronic circuit having a passive circuit component, the circuit board comprising:
   a polymer substrate having
      a non-component region of a polymer resin,
      a component region of a mixture of a polymer resin and a filler material, and
      circuit wiring conductors on a surface of the substrate, wherein
         the filler material, in combination with the circuit wiring conductors, forms the passive circuit component, and
         the substrate includes a plurality of holes adjacent the component region; and
   a wire passing through the plurality of holes and comprising a coil within which the component region is disposed.

8. The circuit board of claim 7 wherein the filler material comprises solid particles.

9. The circuit board of claim 7 wherein the filler material comprises solid particles with an average diameter in a range of 1 to 18 microns.

10. The circuit board of claim 7 wherein the circuit wiring conductors are laminated on opposite sides of the substrate proximate the component region.

11. The circuit board of claim 7 wherein the filler material is selected from the group consisting of particles of cobalt, nickel, polyester, polypropylene, graphite, and silver.

12. A circuit board for an electronic circuit having a passive circuit component, the circuit board comprising:
   a polymer substrate having
      a non-component region of a polymer resin,
      a component region of a mixture of a polymer resin and a filler material, and
      circuit wiring conductors on a surface of the substrate, wherein
         the filler material, in combination with the circuit wiring conductors, forms the passive circuit component,
         the component region is annular, and
         the circuit wiring conductors extend radially across the annular component region.

13. The circuit board of claim 12 wherein the filler material comprises solid particles.

14. The circuit board of claim 12 wherein the filler material comprises solid particles with an average diameter in a range of 1 to 18 microns.

15. The circuit board of claim 12 further including holes in the substrate adjacent the component region and wherein the wiring conductors pass through the holes and comprise a coil, with the component region inside the coil.

16. The circuit board of claim 12 wherein the circuit wiring conductors are laminated on opposite sides of the substrate proximate the component region.

17. The circuit board of claim 12 wherein the filler material is selected from the group consisting of particles of cobalt, nickel, polyester, polypropylene, graphite, and silver.

* * * * *